United States Patent [19]

McCoy et al.

[11] 3,921,101

[45] Nov. 18, 1975

[54] MOSFET CLOCK

[75] Inventors: Michael R. McCoy, San Jose; Terry R. Walther, Sunnyvale, both of Calif.

[73] Assignee: Electronic Arrays, Inc., Mountain View, Calif.

[22] Filed: Oct. 5, 1973

[21] Appl. No.: 403,982

[52] U.S. Cl. .............. 331/108 D; 307/251; 331/111

[51] Int. Cl.² ........................................ H03K 3/353

[58] Field of Search ............. 331/108, 111; 307/251

[56] References Cited

UNITED STATES PATENTS

| | | | |
|---|---|---|---|
| 3,708,757 | 1/1973 | Savarese et al. | 331/108 |
| 3,735,277 | 5/1973 | Wanlass | 331/111 |

OTHER PUBLICATIONS

Electronic Engineering Dec. 1973 p. 13.

*Primary Examiner*—John Kominski

*Attorney, Agent, or Firm*—Ralf H. Siegemund

[57] ABSTRACT

A clock circuit particularly for MOSFET integrated circuit electronics is suggested, wherein RC elements are discrete elements external to an IC chip, while the timing of occurrence of a rapid charge change is internally controlled by MOSFET elements in that chip. This control circuit includes a hysteresis circuit, a delay and a switch, for example, for discharging the capacitor at the end of a cycle. The hysteresis circuit responds to a particular charge state of the capacitor to turn the switch on, the hysteresis circuit reverts belatedly to the reverse state for turning the switch off again, which turning off is further delayed by the delay circuitry so that the capacitor discharges fully.

13 Claims, 3 Drawing Figures

MOSFET CLOCK

BACKGROUND OF THE INVENTION

The present invention relates to a new and improved clock circuit for MOSFET devices.

Electronic circuitry as used in the digital art require usually very accurately operating clocks. Usually, separate clock circuits have been constructed employing discrete circuit elements while the remainder of the electronics is packaged in integrated circuit chips. The inclusion of a clock circuit in an IC package has drawbacks as the parameters cannot be sufficiently accurately controlled. This is particularly true for MOSFET chips.

A RC circuit in an oscillator is often employed in that the capacitor e.g. charges through the resistor and is rapidly discharged at a particular point in time, whereupon charging is resumed in periodic sequence. The result is a saw-tooth type oscillation. The frequency of that oscillator will be constant if the slope of charging is constant and accurately predetermined; if the point of discharging (i.e. voltage across the capacitor when this occurs), is accurately predetermined; and if the capacitor discharges to another predetermined level, e.g. fully. All three conditions present problems of realization in an IC chip.

SUMMARY OF THE INVENTION

It is an object of the present invention to provide for a new and improved clock which is usable directly in conjunction with MOSFET chips.

In accordance with the preferred embodiment of the invention it is suggested to provide the RC circuitry as determining the time constant for a clock as discrete circuit elements while the termination of a cycle and commencement of the next one is controlled through circuitry inside of a MOSFET chip to which the RC circuit is coupled via the chip interface. That circuitry in the MOSFET chip consists basically of three parts. First there is a hysteresis circuit established by MOSFETs which changes its output state at a particular charge state voltage of the capacitor as applied through the interface, while reverting to the opposite state when the charge state of the capacitor is closer to normal, the "normal" state being the one from which each time and clock cycle commences. A second part of the clock control circuitry is a simple FET switch which permits gradual change of the capacitor charge when off, while rapidly returning the capacitor charge state to "normal" when on. The third part of the circuit is a delay circuit for transmitting the change of the hysteresis circuit to the said opposite state to the FET-switch as turn off signal and after the capacitor has reached "normal" state again from which to start a new cycle while the FET switch remains off. The FET switch is turned on when the hysteresis circuit reverses state again in response to the particular charge state of the capacitor gradually assumed while the FET switch is off.

The hysteresis circuit is constructed to render its response to particular charge states dependent upon a particular divider ratio of conductive channel impedances of at least two MOSFETs, while a different divider ratio involving partially different MOSFETs determines the change of state in the opposite direction.

In the preferred form of practicing the invention, plural, cascaded inverters provide for the needed delay between a change of state of the hysteresis circuit for commanding switch turn off, and the actual turning off of that switch.

An external, discrete element RC circuit is preferably a series circuit of a capacitor and of a resistor which are connected between operating voltage and ground. The potential at the connecting junction and terminal of the capacitor and the resistor provides the input for the hysteresis circuit. The FET switch when turned on discharges the capacitor rapidly, the capacitor charges gradually while the switch is off. One could provide the RC circuit as a parallel circuit, and the FET switch when on controls application of a charge voltage to the capacitor, while discharging over the resistor when the switch is off.

The three conditions for frequency predetermination of the oscillator as outlined above, are fully met. The external, descrete resistor determines the charge slope of the capacitor. The accurately determinable divider ratio in the MOSFET hysteresis device determines accurately the response to the charge voltage deemed the peak; and the hysteresis plus delay device as controlling the capacitor discharge switch make sure that the capacitor will fully discharge.

DESCRIPTION OF THE DRAWINGS

While the specification concludes with claims particularly pointing out and distincly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 illustrates generally an integrated circuit chip, schematically denoted at 10 with an interface 11 leading to the external world as far as the chip is concerned. To the left of the interface line 11 one could show other integrated circuit chips, external devices etc. The chip 10 could be, for example, a calculator chip of the type traded under the designation EA 7023 by the assignee corporation, and a companion chip EA 7022 could be connected thereto, via interface 11.

Figure 1:
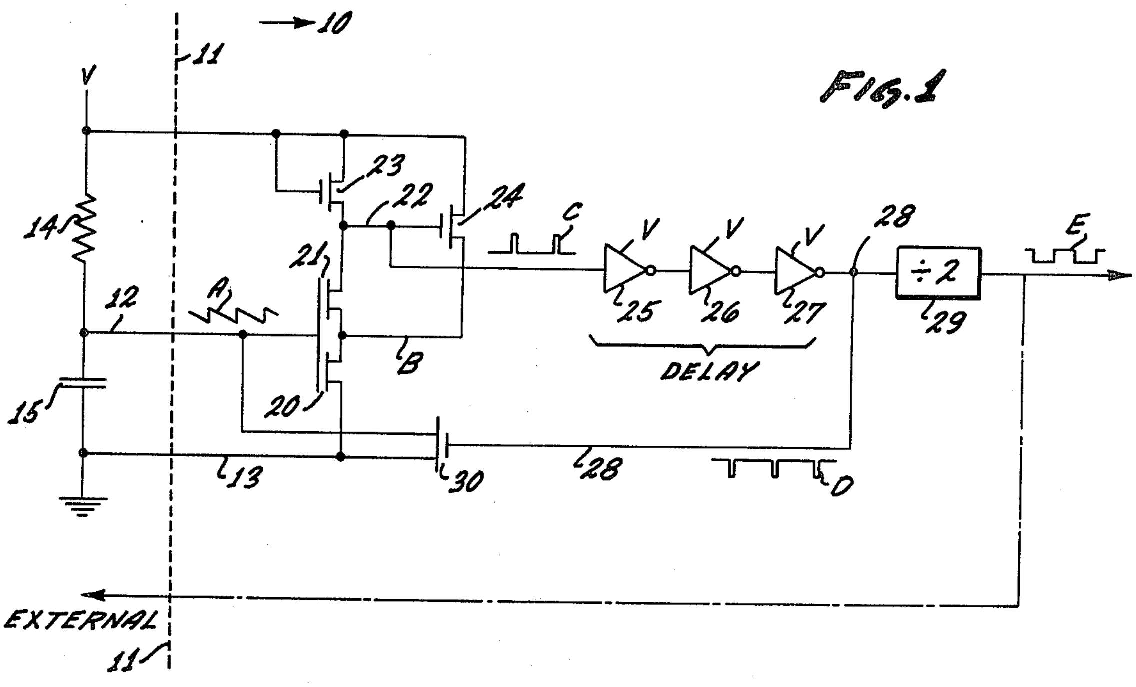
FIG. 1 is a circuit diagram of the preferred embodiment of the invention.

As far as explaining the present invention is concerned, a clock circuit is provided which includes discrete circuit elements external to an MOSFET chip as well as MOSFET elements in that chip, with two connections running through the interface 11. These connections are designated 12 and 13, wherein 13 is actually the ground potential path as provided for the entire circuit in the chip.

Interface connectors such as 12 and 13 include the usual bonding pad on a surface portion of the chip, a wire soldered to the bonding pad and terminal connectors connected to that wire as is generally well known in the art.

The discrete elements of the clock circuit are a discrete element resistor 14 and a capacitor 15 serially connected to each other and between ground and operating potential V, which is the same operating voltage applied to the chip. The junction between capacitor 15 and resistor 14 connects to terminal 12 to provide for the principle operative connection between the RC circuit 14/15 and the circuitry of the oscillator and of the clock inside of the chip.

The elements 14 and 15 are not included in the chip because they determine the time constant of the oscillator, and constancy of the charge slope potential at terminal 12 is critical for constancy and predetermination of the clock frequency. Constancy of frequency depends on two factors: (1) the capacitor must be discharged always when its charge has reached a certain value; and (2) the rate of charge of the voltage from discharge potential (ground) to that certain value must be constant. Item 2 is determined through the accuracy and low tolerances in the parameters of the RC elements 14 and 15; discrete elements are chosen here for that reason. Item 1 is determined by the circuit inside of the chip 10 and to be described next.

Terminal 12 is connected to the gate of a MOSFET comprised of two serially, source-to-drain connected FETs 20 and 21. The source electrode or FET 20 is connected to ground, the drain electrode of FET 21 is connected to a node 22 which is biased to operating potential V by a FET 23 whose gate and drain electrodes are permanently connected to operating voltage V. Node 22 has that potential as long as the transistors 20 and 21 are both not conductive.

It is assumed that the transistors are P-channel devices operating in the enhancement mode. For this reason, operating voltages, and all relevant control voltages and potentials in the circuit are negative to ground.

Node 22 connects to the gate of a feedback transistor 24 whose drain receives also permanently voltage V, while the source electrode connects to the drain-to-source junction of transistors 20,21. Node 22 serves also as the output terminal of the circuit 20–24.

A plurality of (altogether three) simple inverter stages 25, 26, 27 connect serially between node 22 and a terminal 28 (node) in the chip. That terminal connects to a "divide-by-two" circuit 29 to make the clock signal available as a square wave signal inside of chip 10. One can, therefore, see that two oscillator cycles establish one clock cycle. The dash-dot line indicates that the clock can be made available also outside of the chip, for example as a clock signal to be used in companion chip EA-7022; chips EA-7022 and 7023 together establish the electronics of a calculator traded by the assignee corporation under the designation EA-S-129.

Line or terminal 28 connects additionally to the gate of a switching transistor 30 whose source electrode connects to ground, or more accurately within the keeping of the invention, this source electrode connects to the other electrode of capacitor 15 not connected to terminal 12. The drain electrode of FET 30 connects to terminal 12.

Whenever transistor 30 is conductive, it discharges capacitor 15 while the capacitor charges when transistor 30 is nonconductive. The principle function of the circuit as connected between terminal 12 and terminal 28 (other than circuit 29) is (1) to control the onset of capacitor discharge precisely as to time, and on a predetermined and constant level of potential at the junction or terminal 12 and (2) to make sure that the capacitor 15 discharges fully.

Figure 2:
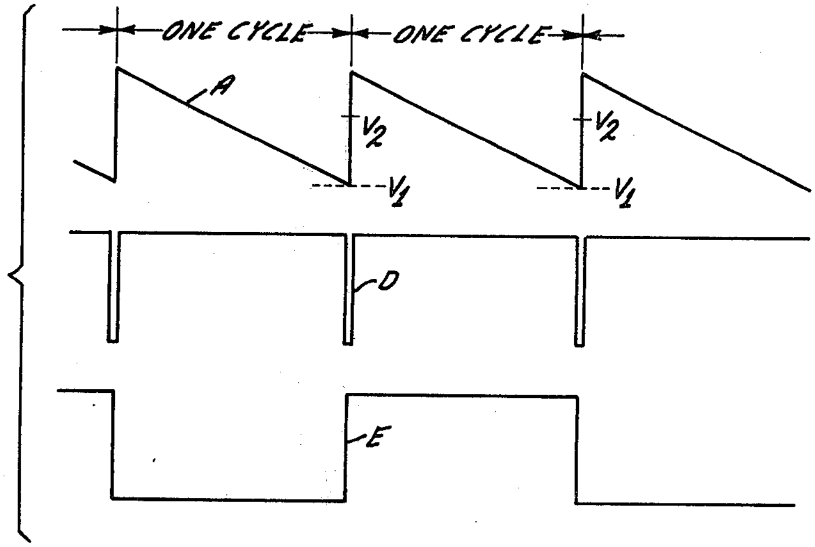
FIG. 2 shows timing diagrams of relevant input and output signals of the oscillator shown in FIG. 1.

It shall be assumed that the potential at junction and terminal 12 runs down in a free-running operation, by charging capacitor 15 down from ground potential (curve A in FIG. 2). That potential is applied to the gate of transistors 20 and 21 which are, however, not conductive during the initial phases of capacitor charging. Transistor 24 is conductive by operation of the voltage V as applied to node 22, so that approximately the same potential is applied to the junction between transistor 20 and 21. This in effect reduces the operating drain-to-source voltage across the transistor 21.

After the potential at terminal 12 has exceeded the threshold of transistors 20 and 21 some current flows through transistors 20 and 24. The voltage at the drain-to-source junction of transistors 20 and 21 depends on the divider ratio of the conductive channels of the FETs 20 and 24. Little current will flow through transistor 20 so that the potential at node B remains below the turnon threshold for FET 21.

Figure 3:
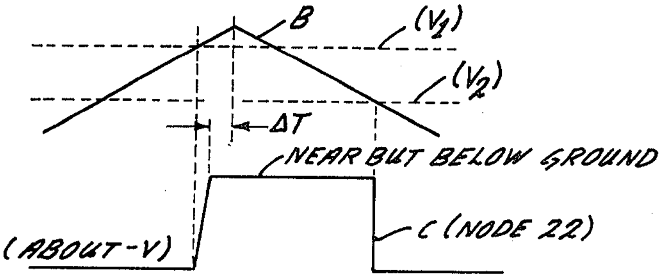
FIG. 3 shows several relevant signals as they occur in a hysteresis stage of the circuit shown in FIG. 1 and on a greatly expanded time scale.

At a particular voltage level $V_1$ at terminal 12, when applied to the gates of transistors 20 and 21, the node potential at node B drops to a value sufficiently close to ground and turns transistor 21 on. The voltage at node 22 then drops which decreases the conduction through 24 drastically, i.e. there is regenerative feedback until the transistors 20 and 21 are fully conductive and conduct while transistor 24 is off, and the potential at node and terminal 22 drops to near ground (see FIG. 3 trace C). Accordingly, a rather steep signal flank is produced at that point, shown as a rising flank in FIG. 3. The timing of this signal flank does not depend on the internal thresholds of the several FETs, but on the divider ratio of the channel impedances of FETs 20 and 24, as that ratio determines the feedback bias as effective across FET 21, whose onset of strong conduction is determined therewith, and that in turn determines the instant of cutoff of FET 24.

The number of inverters connected between terminals 22 and 28 is uneven so that previously, with near-operating potential applied to terminal 22, ground potential was provided at terminal 28, and transistor 30 was cut off; capacitor 12 was permitted to charge accordingly. Now, as the potential at terminal 22 rises to ground, operating potential is established at terminal 28 and turns transistor 30 on (after a slight delay $\Delta T$ (FIG. 3) which is insignificant as far as continued charging of capacitor 12 is concerned).

As transistor 30 is rendered conductive, capacitor 15 is discharged through the transistor. A function of that circuitry 20 through 27 is to prevent premature cutoff of transistor 30, because very soon after the beginning of capacitor discharge the potential at terminal 12 rises at a steep rate and above the particular threshold $V_1$ which rendered transistor 21 fully conductive and turned transistor 24 off. Now it must be prevented that transistor 20 is turned off again too soon so that transistor 24 is not turned on again too soon. This is carried out in a two step process.

Instrumental here in preventing a premature turn off of transistors 20,21 is the fact that the turned off transistor 24 applies near ground potential to the drain-to-source junction of transistor 20,21. The onset of conduction was delayed as previously described because a voltage close to V was applied to the drain-to-source junction of 20/21 having an inhibiting effect as far as conduction is concerned. Now, with near ground applied to the drain-to-source junction of FETs 20,21, turn off of these FETs is, relatively speaking, delayed from the instant the potential at 12 raises again above $V_1$ until a voltage closer to ground has been reached. This rise, of course, is the result of rapid discharge of capacitor 15 and occurs rapidly indeed.

As conduction through transistors 20,21 is gradually reduced with rising voltage at 12, the impedance divider ratio of conducting transistors 23,21,20 comes into play. Turning on of the transistor 24 occurs when its threshold has been reached rendering the transistor conductive, and that in turn turns transistors 20,21 off completely in regenerative feedback operation. This occurs at a voltage $V_2$ as far as the potential at terminal 12 is concerned, which lies somewhere in between $V_1$ and ground.

It can readily be seen that the spread of $V_1$–$V_2$ is instrumental in this hysteresis effect and that spread is determined, on the one hand by the channel impedance divider ration of FETs 20 and 24, and on the other hand by the channel impedance divider ratio of FETs 20,21 and 23. It should be noted here that impedance divider ratios can be much more accurately controlled as far as making MOSFET chips is concerned than particular impedance values can be established on an absolute value scale. Divider ratios are usually established as area ratios. As far as determining the size of the MOSFETs is concerned, size relates directly to impedance.

It is not, however, desirable to turn transistor 30 off when the charge level at terminal 12 has reached $V_2$ because at that point capacitor 15 is still not fully discharged. Turn off of the discharge control transistor 30 should be delayed until the capacitor discharge is in fact completed. This then is the purpose of the delay introduced by the three inverters 25,26, and 27. Three inverters suffice, but more could be provided if they were needed. These three inverters shift the downswing in potential at terminal 22, as transistor 24 is cut off, so that there is a delay, sufficiently long for the potential at 12 to rise to ground before that downswing at terminal 22 has reached FET 30 (as an upswing to ground) and now FET 30 can be cut off without danger as to complete discharge.

As the capacitor 12 is completely discharged the beginning of the new saw-tooth wave is defined as to voltage level, namely ground, and the length of that wave is determined only by the response voltage $V_1$ for the circuit 21–24.

It can readily be seen also that a somewhat too large delay as between the turning on of FET 24 and the propagation of the resulting signal flank to the gate of FET 30, is not detrimental, because these delays are small in relation to the period of capacitor charge. Too short a delay, however, is detrimental as the capacitor must always assume a particular level (e.g. zero volts) in the beginning of a new charge period.

The invention is not limited to the embodiments described above but all changes and modifications thereof not constituting departures from the spirit and scope of the invention are intended to be included.

We claim:

1. An oscillator circuit for cooperation with and use in integrated circuit chips of the MOSFET variety, comprising:

an RC circuit connected between an operating voltage and ground and having a terminal, the RC circuit composed of discrete circuit elements which include at least one capacitor and at least one resistor connected thereto, the potential of said terminal representing the charge state of the capacitor, the potential of said terminal changing gradully from a first charge state of the capacitor towards a second charge state thereof through current flow through the resistor;

a hysteresis circuit in the chip having an input terminal connected through an interface connector to the terminal of said RC circuit and having an internal output terminal, said circuit being constructed from MOSFET elements and being connected to operating potential and ground potential as applied to the chip to have in each instant a first or a second switching state in which respectively first and second level outputs are effective at the internal output terminal, one of the first and second level outputs having value close to ground potential, the other one of the first and second level outputs being different from ground, the hysteresis circuit provided for switching from the first level output to the second level output when the potential of the terminal reaches a level corresponding to the second charge state of the capacitor, and for returning to the first level output when the potential at the terminal is at a level different from the level as corresponding to the second charge state, but corresponding to a third charge state in between the first charge state and the second charge state;

a delay circuit connected to the output of said hysteresis circuit to provide a switching signal when the hysteresis circuit switches its output from the first to the second level and a turn-off signal when the hysteresis circuit switches its output from the particular second to the first level but at a particular delay; and an electronic switch connected to the capacitor for rapidly changing the charge of the capacitor from the second towards the first charge state in response to the switching signal from the delay circuit, the electronic switch being turned off when the delay circuit transmits to the switch delayedly the change of the hysteresis circuit output from the second level to the first level, the delay being sufficient so that the electronic switch is not turned off until the capacitor has reached the first charge state.

2. An oscillator circuit as in claim 1, wherein the hysteresis circuit is constructed from plural MOSFET elements connected between operating voltage and ground and establishing a first current path being conductive as the first output state of the hysteresis circuit and maintained while the capacitor changes charge state gradually from the first to the second state, and a second conductive current path being conductive as the second output state of the hysteresis circuit and maintained while the capacitor changes charge state from the second to the third state.

3. An oscillator circuit as in claim 2, wherein the first conductive current path includes a first FET and second FET with a junction, the first FET connected to said terminal; and a circuit connected also to said terminal and connecting the junction to the gate of the second FET to obtain cutoff of the second FET when the potential at said terminal controls conduction through the first to obtain a particular potential at said junction dependent on the voltage divider ratio of the impendance of the first and second FETs of the first current path.

4. An oscillator as in claim 3, wherein said circuit includes a third FET having its source-to-drain path connected serially between the drain of the first FET and the gate of the second FET, the gate of of the third FET being connected to said terminal.

5. An oscillator as in claim 4, wherein the gate of the second FET connects to a fourth FET for biasing the gate to operating as long as the third FET is not conductive, the first, third and fourth FETs establishing the second conductive path, when the second FET is not conductive, the impedance ratio of first, third and fourth FETs determining the onset of conduction of the second FET.

6. An oscillator circuit as in claim 1, wherein the hysteresis circuit includes a pair of serially connected FETs with a common gate connected to said RC circuit terminal, the source of one of the FETs being connected to ground, the drain of the other one of the FETs being connected to a noed; a third FET connected for biasing the node to operating potential, a fourth FET having its gate connected to said node, the node being said output terminal, having its source electrode connected to the drain-to-source junction between the first and second FETs to provide feedback thereto tending to impede conduction of at least one of the serially connected FETs and tending to impede change to non-conduction respectively on conduction and non-conduction of the fourth FET, the fourth FET having its drain electrode connected to operating potential.

7. An oscillator as in claim 1, wherein the capacitor and resistor of the RC circuit are serially connected between an operating voltage and ground, said electronic switch connected across the capacitor, said third charge state being substantially complete discharge of the capacitor.

8. In an electronic circut, the improvement of a hysteresis circuit having first, second, and third MOSFETs, each MOSFET having drain, source and gate electrodes, the first, second and third MOSFETs being connected serially with their source and drain electrodes to each other and between operating voltage and ground, the gates of the first and second MOSFETs receiving a control voltage, the gate and drain of the third MOSFET being connected to receive operating potential; and a fourth MOSFET having its gate connected to a junction of the third and second MOSFET as defined by source-to-drain connetion of these MOSFETs, the source of the fourth MOSFET being connected to a junction between the first and second MOSFETs as defined by source-to-drain connection of these MOSFETs, the drain of the fourth MOSFET connected to operation potential, so that the fourth MOSFET remains conductive for a first range of the control voltage having value above the threshold of conduction of the first and second MOSFET but wherein bias applied by the drain of the fourth MOSFET to the drain of the second MOSFET inhibits conduction thereof by operation of the impedance divider ratio effective through current flow through the first and fourth MOSFETs, and wherein for a second range of control voltages, overlapping the first range, the impedance divider ratio as effective on the gate of the fourth transistor by operation of current flow through the first, second and third MOSFETs keeps the fourth transistor non-conductive, until the control voltage has reached a value within said first range, causing the first and second MOSFETs to become regeneratively conductive under control of a bias change as resulting from rapid non-conduction of the fourth MOSFET.

9. In a circuit as in claim 8, wherein the control voltage is saw-tooth voltage, and including circuit means connected to the gate of the fourth transistor for controlling the generation of the saw-tooth voltage to establish an oscillator.

10. An oscillator circuit for cooperation with and use in an integrated circuit chip of the MOSFET variety, comprising:

an RC circuit made of discrete circuit elements which include a capacitor and a resistor serially connected between an operating voltage and ground and having a junction terminal, the potential of said terminal representing the charge state of the capacitor;

a MOSFET switch having its main electrodes connected across the capacitor to discharge the capacitor when conductive, the capacitor charging via said resistor when the switch is not conductive;

a first and second MOSFET in the chip each having source, drain and gate electrodes, the source of the first MOSFET being grounded, the drain of the first MOSFET being connected to the source of the second MOSFET, the gates of the first and second MOSFET being connected to said junction terminal;

a third MOSFET in the chip having its gate connected to the drain of the second MOSFET, its drain connected to receive operating potential and its source connected as a feed-back to the interconnected drain and source of the first and second MOSFETs and acting with the first MOSFET in voltage divider configuration to establish a particular voltage value for which the second MOSFET is turned on;

a fourth MOSFET in the chip connected to be permanently conductive and connected to the drain of the second MOSFET to act therewith in impedance divider configuration to determine a second particular voltage value for the second MOSFET is turned off, so that the third MOSFET is conductive when the second is not and vice versa, the first and second MOSFET rendered conductive when the capacitor has charged to provide said first particular value, and non-conductive, when the capacitor has lost a significant charge due to discharge through the said switch, so that the second particular voltage is effective at said terminal; and a delay circuit in the chip connected to the third MOSFET and to the gate of the switch for rendering the switch conductive at a particular delay, when the third MOSFET is rendered conductive and for rendering the switch non-conductive when the third MOSFET is rendered non-conductive and at a particular delay so that the capacitor is discharged completely.

11. An oscillator circuit for cooperation with and use in integrated circuit chips of the MOSFET variety, comprising:

an RC circuit connected between an operating voltage and ground and having a terminal, the RC circuit composed of discrete circuit elements which include at least one capacitor and at least one resistor connected thereto, the potential of said terminal representing the charge state of the capacitor, the potential of said terminal changing gradually from a first charge state towards a second charge state through current flow through the resistor;

a MOSFET device with gate input, drain and source electrodes, and a feedback input, the gate connected to ground;

a first MOSFET with gate to drain connection to the operating voltage and having its source connected to the drain of said device and establishing a particular divider ratio therewith;

a feedback MOSFET having its gate connected to the source of said first MOSFET, its drain connected to receive operating potential and its source connected to the feedback input of said MOSFET device and establishing another impedance ratio with part of the MOSFET device to impede onset of conduction through the MOSFET device when said feedback MOSFET is conductive, so that the device will be rendered conductive in dependence upon the other impedance ratio as detection response to reaching of the second charge state by the capacitor and to impede onset of non-conduction of the MOSFET device when the feedback MOSFET is non-conductive, but to render the device non-conductive in regenerative action in dependence upon the particular divider ratio for the third charge state of the capacitor;

a switch connected to the capacitor for rapidly changing its charge state from the second to the first charge state when conductive; and circuit means connected for controlling the switch in dependence upon conduction and non-conduction of the MOSFET device, for causing the switch to rapidly change said capacitor charge state after the MOSFET device has been rendered conductive and turning the switch off at a delay following the rendering of the MOSFET device to be non-conductive, the delay being sufficient to cause the capacitor to reach the first charge state from the third charge state which caused the MOSFET device to become non-conductive.

12. In an electronic circuit of the integrated variety and using MOSFETs as active elements, wherein a control voltage appears at an internal terminal changing value for a range up to a first value and back to and exceeding a second value, the improvement comprising:

a first and second MOSFET in the chip each having source, drain and gate electrodes, the source of the first MOSFET being grounded, the drain of the first MOSFET being connected to the source of the second MOSFET, the gates of the first and second MOSFET being connected to the control terminal;

a third MOSFET in the chip having its gate connected to the drain of the second MOSFET, its drain connected to receive operating potential and its source connected as a feedback to the interconnected drain and source of the first and second MOSFETs and acting with the first MOSFET in voltage divider configuration to establish the first voltage value for which the second MOSFET is turned on;

a fourth MOSFET in the chip connected to be permanently conductive and connected to the drain of the second MOSFET to act therewith in impedance divider configuration to determine to the second voltage value for the second MOSFET is turned off.

13. In an oscillator circuit wherein an RC circuit with control switch is provided for obtaining gradual charge state changes on the capacitor through the resistor for open switch and rapid charge state changes in the opposite direction for closed switch, there being a junction terminal from which a voltage can be derived in relation to ground, the improvement comprising:

a first and second MOSFET in the chip each having source, drain and gate electrodes, the source of the first MOSFET being grounded, the drain of the first MOSFET being connected to the source of the second MOSFET, the gates of the first and second MOSFET being connected to said junction terminal;

a third MOSFET in the chip having its gate connected to the drain of the second MOSFET, its drain connected to receive operating potential and its source connected as a feed-back to the interconnected drain and source of the first and second MOSFETs and acting with the first MOSFET in voltage divider configuration to establish a particular voltage value for which the second MOSFET is turned on;

a fourth MOSFET in the chip connected to be permanently conductive and connected to the drain of the second MOSFET to act therewith in impedance divider configuration to determine a second particular voltage value for the second MOSFET is turned off;

circuit means connecting the said junction terminal to the gates of the first and second MOSFETs for applying said voltage thereto, so that the particular voltage occurs following a gradual change in charge state for turning the second MOSFET on, while the second particular voltage occurs during a rapid change in charge state; and a delay circuit in the chip connected to the third MOSFET and to the gate of the switch for closing the switch at a particular delay, when the third MOSFET is rendered conductive and for opening the switch when the third MOSFET is rendered non-conductive and at a particular delay, so that the capacitor charge returns completely to a particular value from which to change charge gradullay to a value at which the particular voltage is again applied to the gates of the first and second MOSFETs.

* * * * *